United States Patent [19]
Ono et al.

[11] Patent Number: 5,155,736
[45] Date of Patent: Oct. 13, 1992

[54] SEMICONDUCTOR LASER ELEMENT CAPABLE OF CHANGING EMISSION WAVELENGTH, AND METHOD OF DRIVING THE SAME

[75] Inventors: Takeo Ono, Sagamihara; Hajime Sakata, Hiratsuka, both of Japan

[73] Assignee: International Business Machines Corporation, Armonk, N.Y.

[21] Appl. No.: 790,832

[22] Filed: Nov. 14, 1991

Related U.S. Application Data

[62] Division of Ser. No. 504,626, Apr. 4, 1990, Pat. No. 5,088,097.

[30] Foreign Application Priority Data

Apr. 4, 1989 [JP] Japan ................ 1-83928
Jul. 14, 1989 [JP] Japan ............... 1-180396
Jul. 19, 1989 [JP] Japan ............... 1-184580

[51] Int. Cl.⁵ .................................... H01S 3/10
[52] U.S. Cl. ............................ 372/20; 372/50; 372/96; 385/2
[58] Field of Search .......... 372/20, 45, 46, 50, 372/96; 385/2

[56] References Cited

U.S. PATENT DOCUMENTS

| | | | |
|---|---|---|---|
| 4,829,535 | 5/1989 | Utaka | 372/50 |
| 4,856,005 | 8/1989 | De et al. | 372/20 |
| 4,873,691 | 10/1989 | Uomi et al. | 372/20 |
| 4,885,753 | 12/1989 | Okai et al. | 372/45 |
| 4,887,274 | 12/1989 | Hayakawa et al. | 372/45 |
| 4,899,361 | 2/1990 | Numai | 372/50 |

*Primary Examiner*—Georgia Y. Epps
*Attorney, Agent, or Firm*—Curtis G. Rose

[57] ABSTRACT

A semiconductor laser element capable of changing an oscillation wavelength over a wide range without increasing a threshold current is disclosed. A wavelength selective filter capable of changing a selected wavelength over a wide range is also disclosed. The semiconductor laser element has a substrate and a laser resonator formed on the substrate by stacking semiconductor layers including an active layer and an optical waveguide layer of a superlattice structure. The resonator includes a first reflection portion, an active portion, a phase adjustment portion and second reflection portion which are juxtaposed in a resonance direction. Diffraction gratings are formed in the optical guide layer of the first and second reflection portions. Electrodes are independently formed in the active portion, the phase adjustment portion and the first and second reflection portions. Further, a method for driving the semiconductor laser is disclosed.

10 Claims, 15 Drawing Sheets

SEMICONDUCTOR LASER ELEMENT CAPABLE OF CHANGING EMISSION WAVELENGTH, AND METHOD OF DRIVING THE SAME

This application is a division of application Ser. No. 07/504,626 filed Apr. 4, 1990, U.S. Pat. No. 5,088,097.

BACKGROUND OF THE INVENTION

1. Field of the Invention

The present invention relates to a semiconductor laser element which can vary an emission frequency and is suitable for use in, e.g., an optical communication system, and a method of driving the same.

2. Background of the Invention

Semiconductor laser elements of various structures are known. Of these elements, a distributed Bragg-reflection (DBR) variable-wavelength semiconductor laser element has a good monochromatic characteristic of emission light, and can control an oscillation wavelength. For this reason, when the DBR semiconductor laser element is used in optical fiber communications, it can advantageously transmit a large volume of information at a very high speed without being influenced by material dispersion of an optical fiber. Thus, the DBR semiconductor laser has been developed as a future communication light source for coherent optical transmission.

FIG. 1 is a sectional view of a DBR variable-wavelength semiconductor laser element having a conventional structure when viewed from a plane parallel to a resonance direction of the element.

In FIG. 1, an n-type cladding layer 1', an active-optical waveguide layer 2, and a p-type cladding layer 3 are sequentially stacked on an n-type semiconductor substrate 1. In these semiconductor layers, a first DBR portion, an active portion, a phase adjustment portion, and a second DBR portion are juxtaposed in a laser resonance direction. In these portions, electrodes, 4, 5, 6, and 4' are independently formed. A common electrode 7 is formed on the bottom surface of the substrate 1. Grooves 9, 9', and 9'' are formed at boundaries of these portions. Diffraction gratings 8 and 8' are formed in the layer 2 of the first and second DBR portions.

In this element, when a current $I_{LD}$ is injected from the electrode 5 to the active-optical waveguide layer 2, light is emitted. This light propagates through the layer 2, and only light components having specific wavelengths are reflected by the diffraction gratings 8 and 8' in the two DBR portions, thus causing laser resonance. When a current $I_{tune}$ is injected from the electrodes 4 and 4', a carrier-electron gas is accumulated in the layer 2 by this current. The refractive index of the layer 2 is changed by a plasma effect. When the refractive index of the second layer 2 is changed in this manner, the wavelength of light components reflected by the diffraction gratings 8 and 8' is shifted, so that a laser oscillation wavelength can be changed accordingly. The phase adjustment portion adjusts the phase of light reflected by the DBR portions so as to cause this element to oscillate in a single mode. The phase can be adjusted in such a manner that a current $I_{phase}$ is injected from the electrode 6, and the refractive index of the layer 2 is changed by utilizing the plasma effect.

Of the two portions in the conventional element, for the DBR portion, since the cycle of the diffraction grating sensed by light is changed due to a change $\Delta n$ in refractive index, a Bragg reflection wavelength is shifted. A wavelength fluctuation $\Delta \lambda_b$ at this time can be expressed as follows by a carrier injection amount $\Delta N_b$ which changes according to the current $I_{tune}$ applied from the electrodes 4 and 4':

$$\Delta \lambda_b = \frac{\lambda \xi (\partial n/\partial N)}{n_{beff}} \Delta N_b \qquad (1)$$

where $\lambda$ is the Bragg wavelength when $I_{tune} = 0$, $n_{beff}$ is the effective refractive index of the DBR portion, $\xi$ is the light confinement coefficient of the layer 2, and $\partial n/\partial N$ is the refractive index change coefficient as a function of a carrier change caused by the plasma effect.

In the phase adjustment portion, assuming that a carrier is changed by $\Delta N_p$ by the current $I_{phase}$ applied from the electrode 6, a change $\Delta \lambda_p$ in oscillation wavelength can be expressed by:

$$\Delta \lambda_p = \frac{l_p \lambda \xi (\partial n/\partial N)}{n_{aeff} l_a + n_{peff} l_p + 2 n_{beff} l_b} \Delta N_p \qquad (2)$$

where $n_{aeff}$ and $n_{peff}$ are the effective refractive indices of the active portion and the phase adjustment portion, respectively, and $l_a$, $l_p$, and $l_b$ are the lengths of the active portion, the phase adjustment portion, and the DBR portion, respectively. Upon comparison between equations (1) and (2), equation (2) can yield a smaller $\Delta \lambda$ in unit of the same number of carriers than that of equation (1). More specifically, the current $I_{phase}$ must be set to be higher than the current $I_{tune}$. When a wavelength is to be varied, the element produces heat by the current $I_{phase}$, and the refractive index is increased. As a result, a change in width of the refractive index is suppressed, and a wavelength variation width is decreased.

In order to obtain a sufficiently large $\Delta \lambda_p$, as can be understood from equation (2), the length of the phase adjustment portion must be increased to some extent. For this reason, a loss is increased, and a threshold current is increased accordingly.

On the other hand, Japanese Patent Laid-Open Nos. 62-2213, 62-241387, 63-133105, and the like disclose techniques for forming a wavelength selective filter using a structure similar to that of the above-mentioned semiconductor laser. FIG. 2 is a side sectional view showing such an example of a conventional wavelength selective filter.

In FIG. 2, a buffer layer 78, an optical waveguide layer 72, an active layer 71, and a cladding layer 79 are sequentially formed on a substrate 77. This multilayered structure is divided into a light gain portion 74, a phase control portion 75, and a DBR portion 76 in a light propagation direction. Electrodes $80_1$, $80_2$, and $80_3$ from which currents can be independently injected are respectively formed on these portions. A diffraction grating 73 is formed in the optical waveguide layer 72 of the DBR portion.

Light incident from one end face of the filter propagates through the optical waveguide layer 72, and emerges from the other end face. In this case, a light component having a wavelength which satisfies a Bragg condition of the diffraction grating 73 is reflected by the DBR portion 76, and does not emerge from the other end face. When a current is injected from the electrode $80_3$, a refractive index of the optical waveguide layer 72 is changed by a plasma effect, thus tuning the wavelength of the light component reflected by the diffraction grating 73. When a current is injected from the electrode $80_1$, propagation light is given with a gain from the active layer 71. Furthermore, when a current is injected from the electrode $80_2$, the phase of the propagation light is adjusted.

In the above-mentioned filter, however, when a current is injected for tuning, a light gain and a naturally discharged light intensity are also changed. For this reason, in order to realize stable wavelength selectivity and to assure sufficient crosstalk with a non-selected wavelength, a carrier injection amount must be limited. The plasma effect by carrier injection has an effect of decreasing the refractive index, while heat produced by carrier injection has an effect of increasing the refractive index. For this reason, the refractive index is decreased with an increase in carrier injection amount, i.e., an increase in injection current, while the refractive index is increased due to heat produced by the current. Therefore, the refractive index is saturated to a predetermined value, and a tuning range of a selected wavelength is limited to a narrow range.

SUMMARY OF THE INVENTION

It is an object of the present invention to solve the conventional problems, and to provide a semiconductor laser element which can change an oscillation wavelength over a wide range without increasing a threshold current, and a method of driving the same.

It is another object of the present invention to provide a wavelength selective filter which can change a selected wavelength over a wide range.

In order to achieve the above objects, there is provided a semiconductor laser element which can change an emission wavelength, comprising:
 a substrate;
 a laser resonator formed on the substrate, the resonator being formed by stacking semiconductor layers including an active layer and an optical waveguide layer of a superlattice structure, and the resonator including a first reflection portion, an active portion, a phase adjustment portion, and a second reflection portion which are juxtaposed in a resonance direction;
 diffraction gratings formed in the optical guide layer of the first and second reflection portions; and
 electrodes independently formed in the active portion, the phase adjustment portion, and the first and second reflection portions.

The semiconductor laser element is driven by the following steps. That is, a method of driving the semiconductor laser element, comprises the steps of:
 injecting a current from the electrode of the active portion to the active layer to cause laser oscillation;
 injecting a current from the electrodes of the first and second reflection portions to change a refractive index of the optical waveguide layer, thereby changing a wavelength of light undergoing laser oscillation; and
 applying a reverse bias voltage to the electrode of the phase adjustment portion to change a refractive index of the optical waveguide layer by a quantum confinement Stark effect, thereby adjusting a phase of light undergoing laser oscillation.

Figure 4:
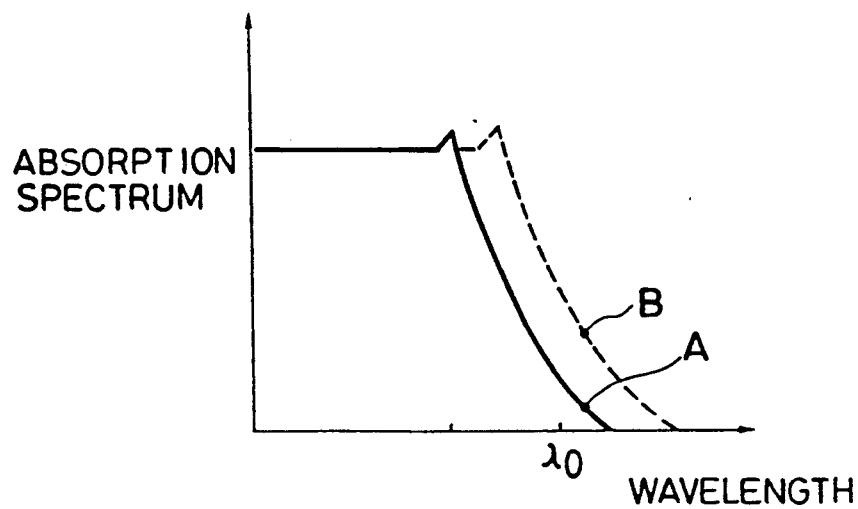
Figure 5:
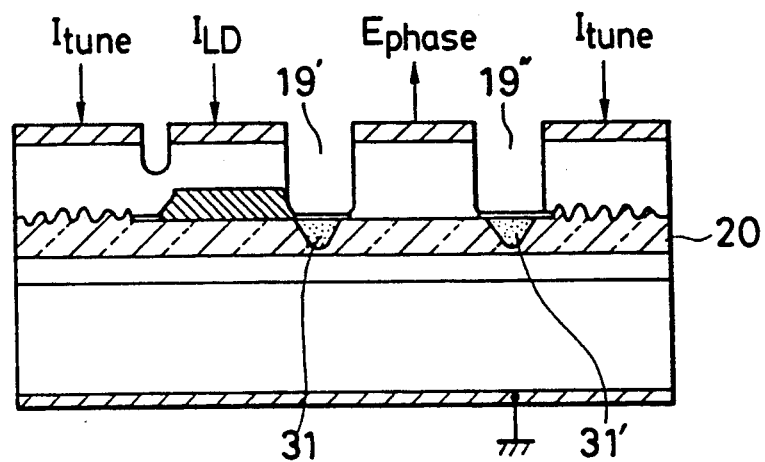
Figure 6:
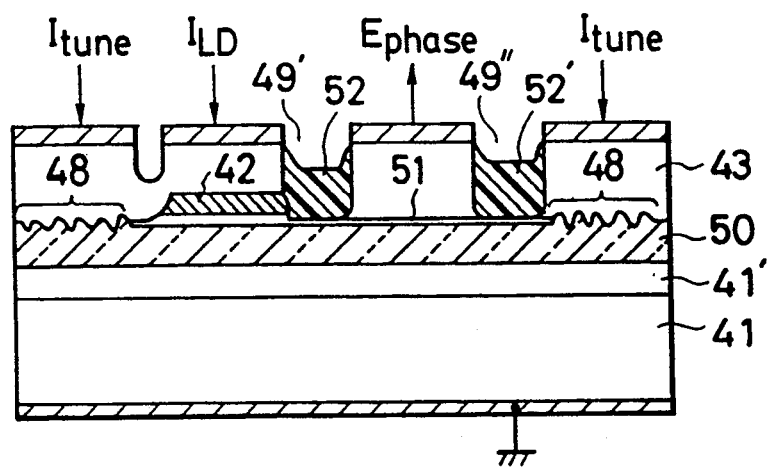
Figure 7:
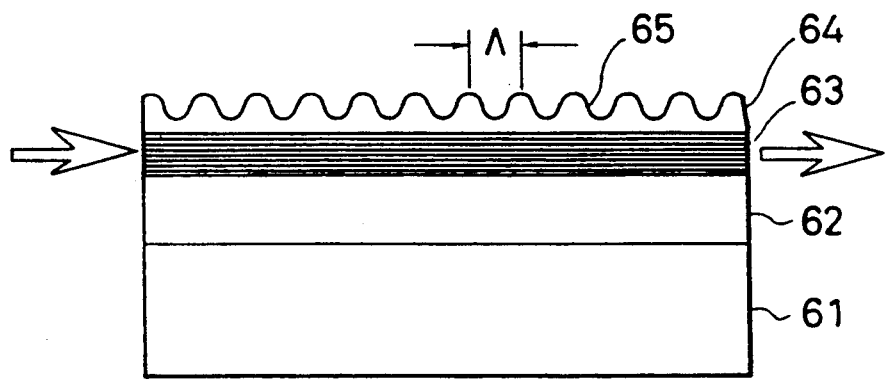
Figure 8:
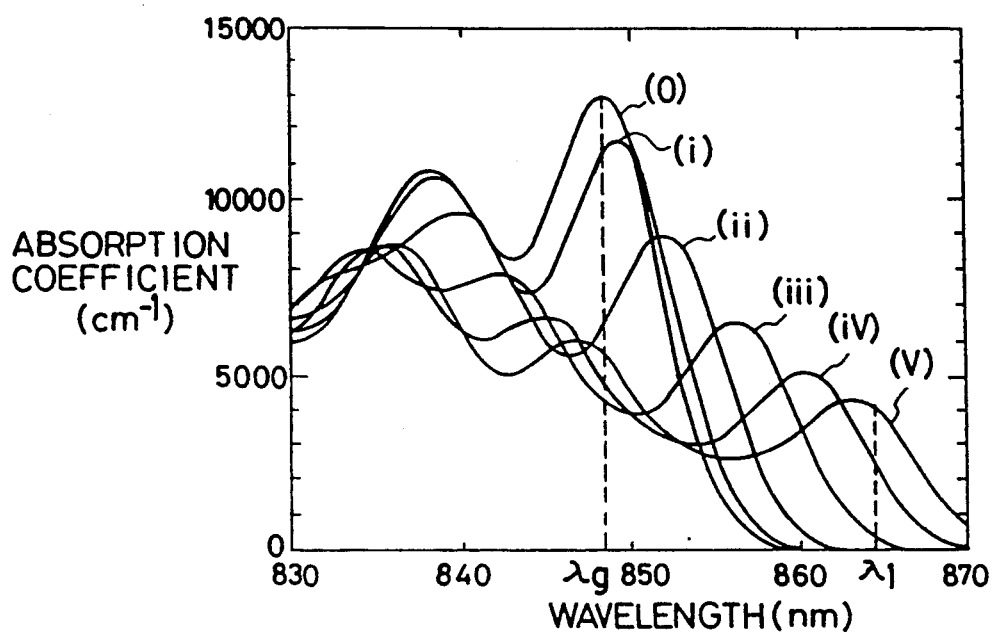
Figure 9:
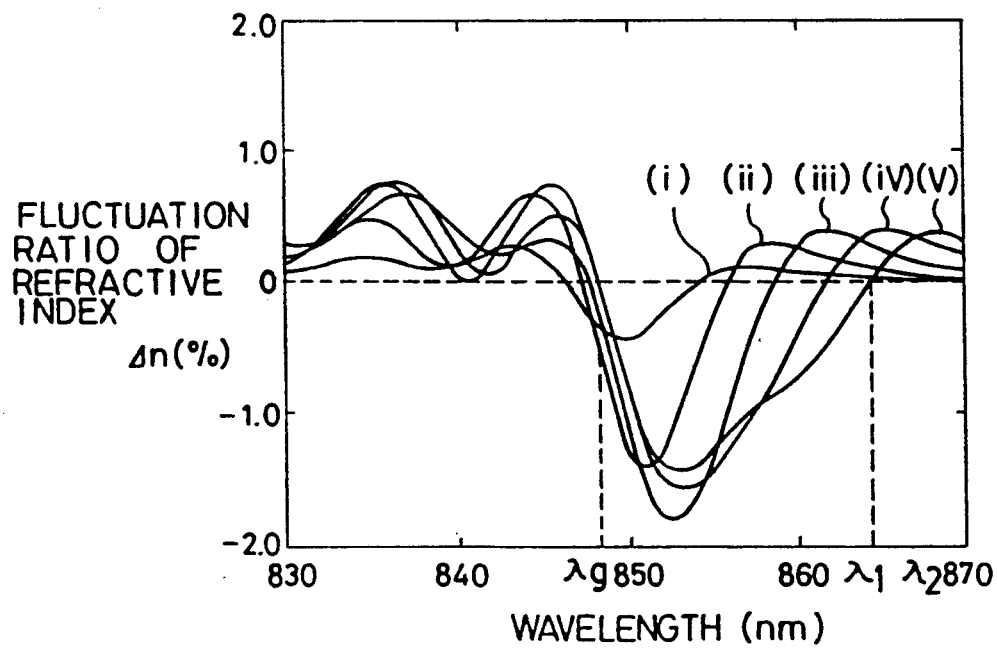
Figure 10:
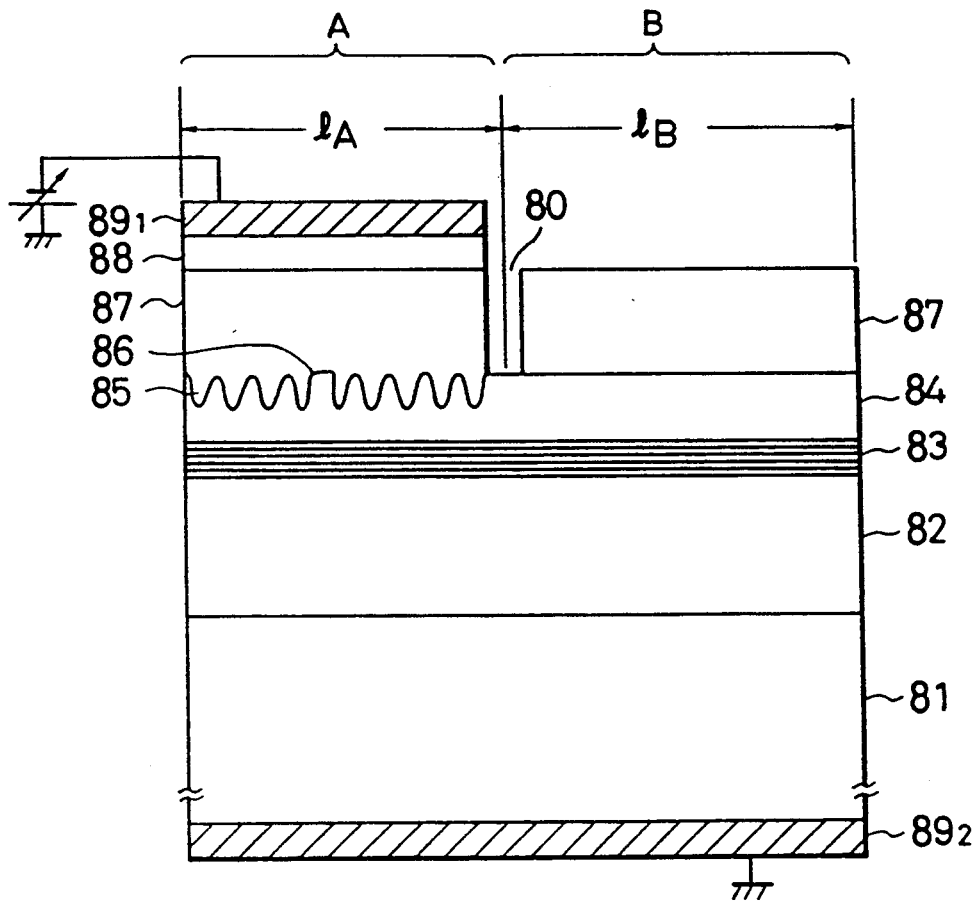
Figure 11:
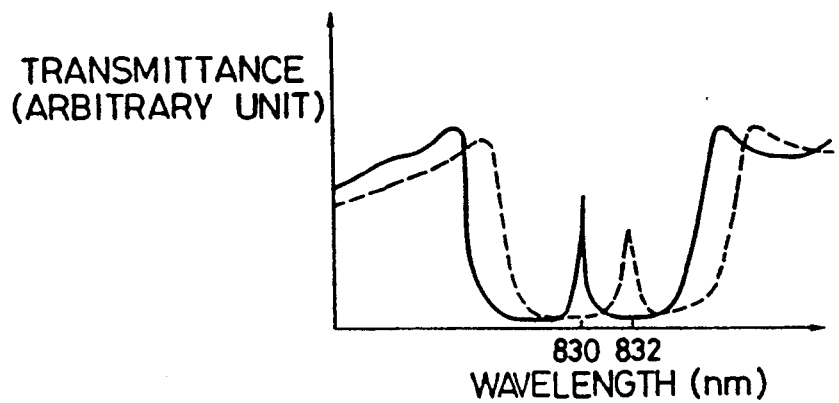
Figure 12:
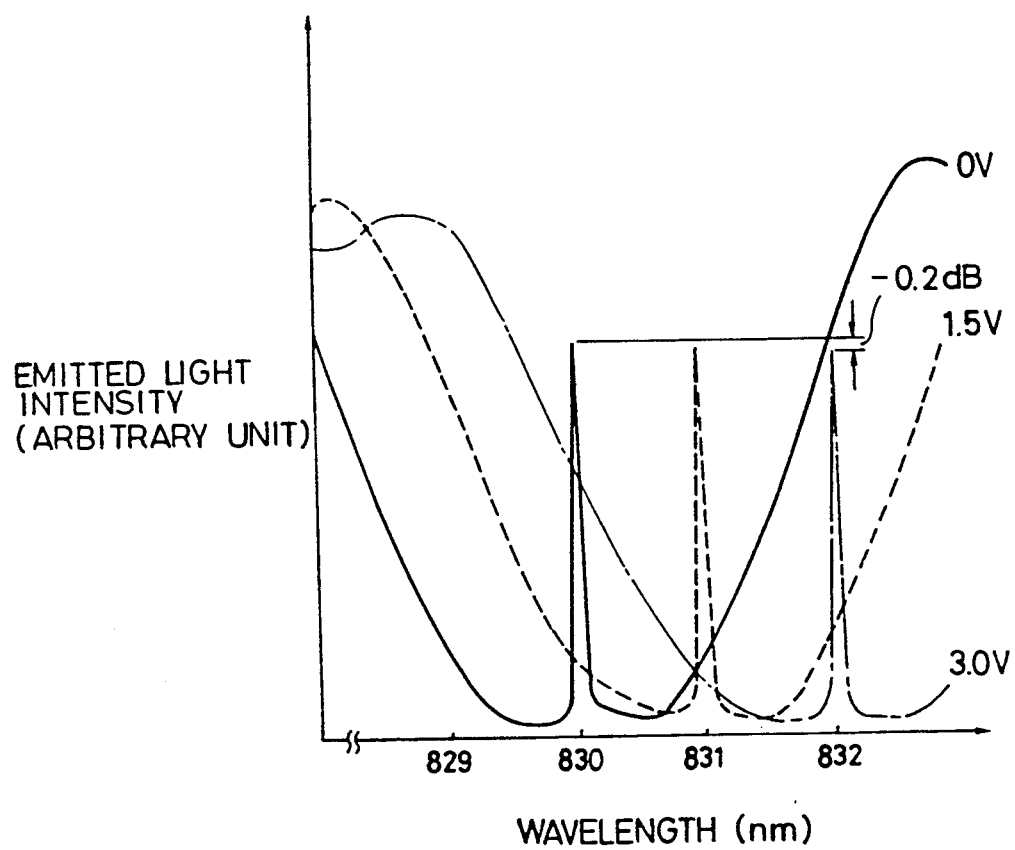
Figure 13:
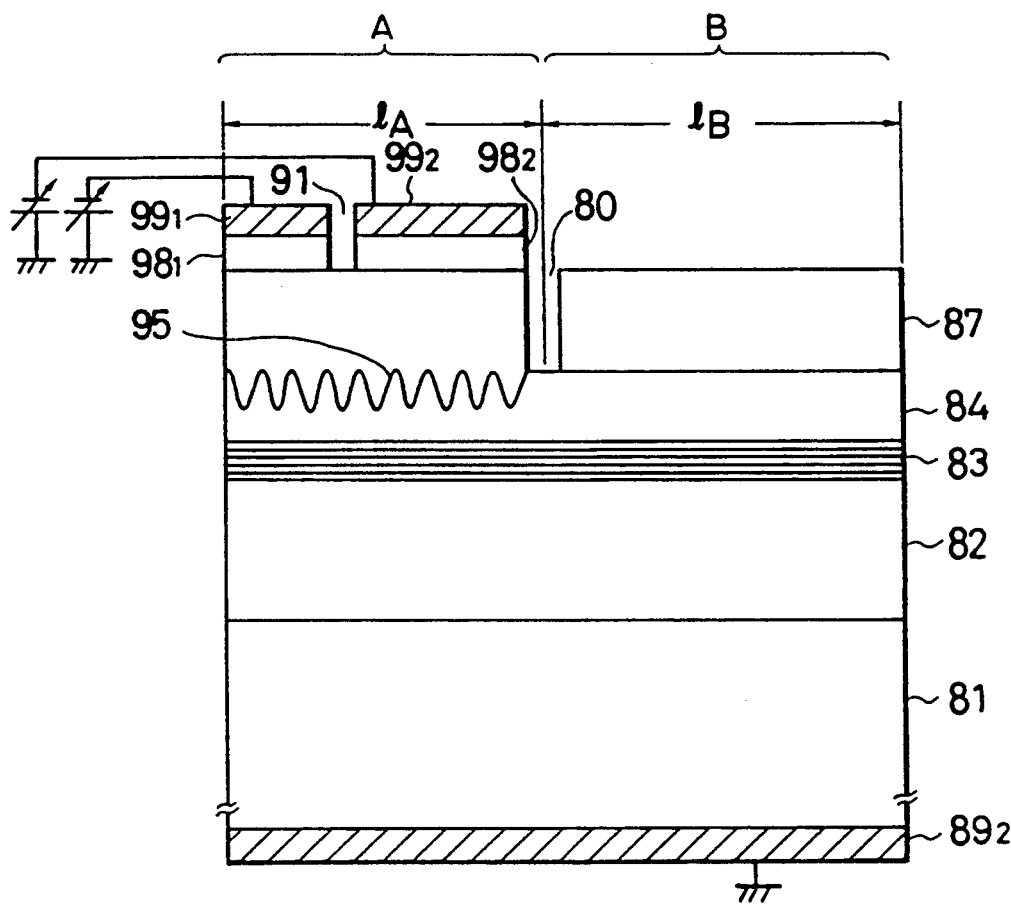
Figure 14:
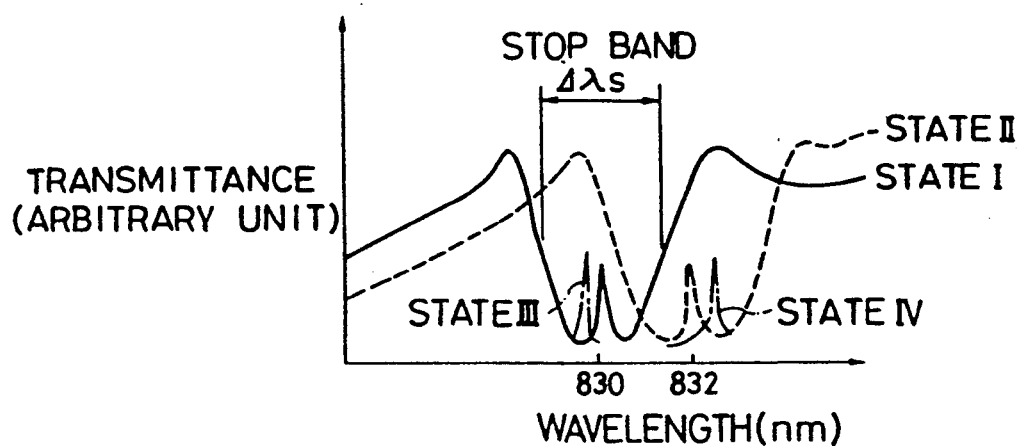
Figure 15:
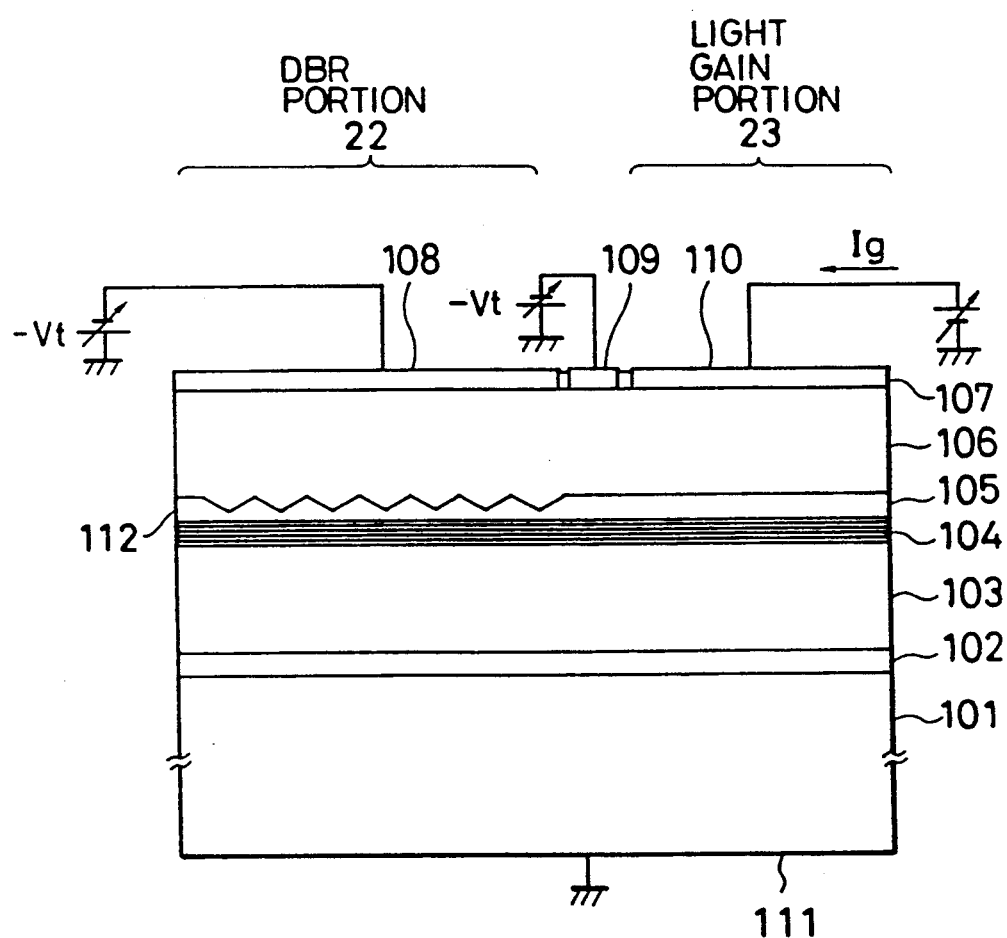
Figure 16:
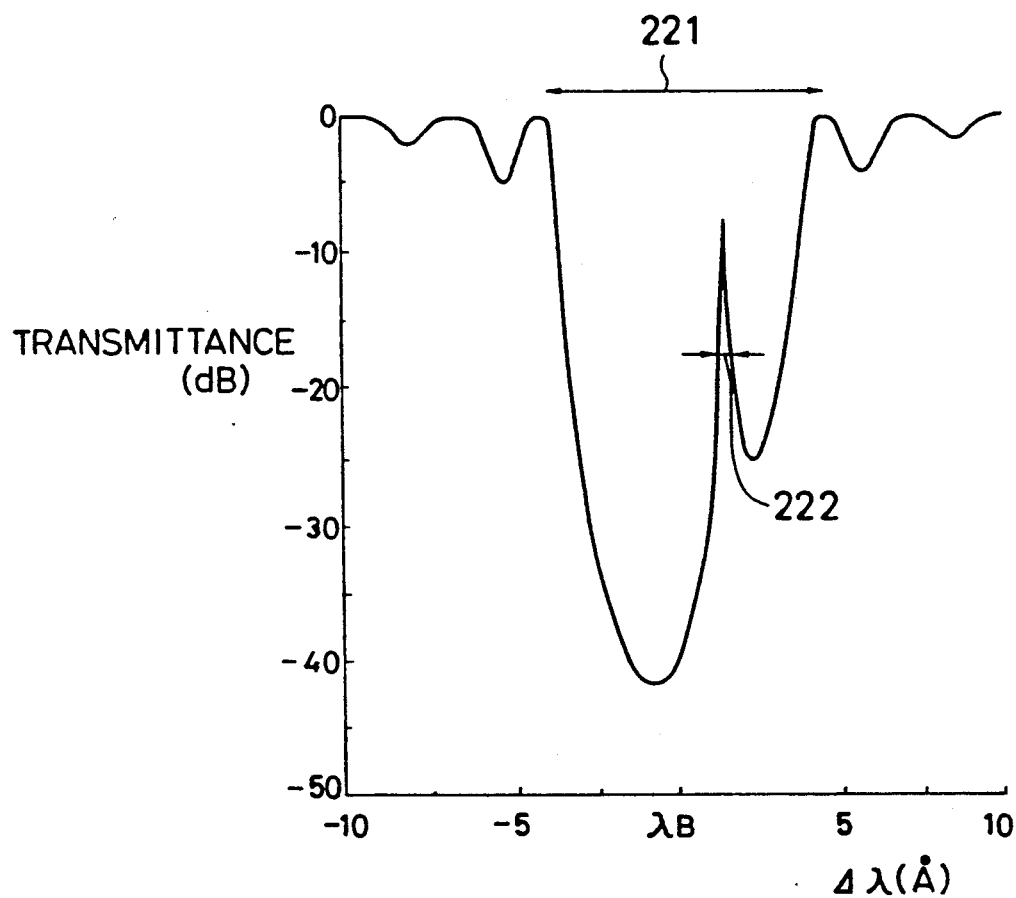
Figure 17:
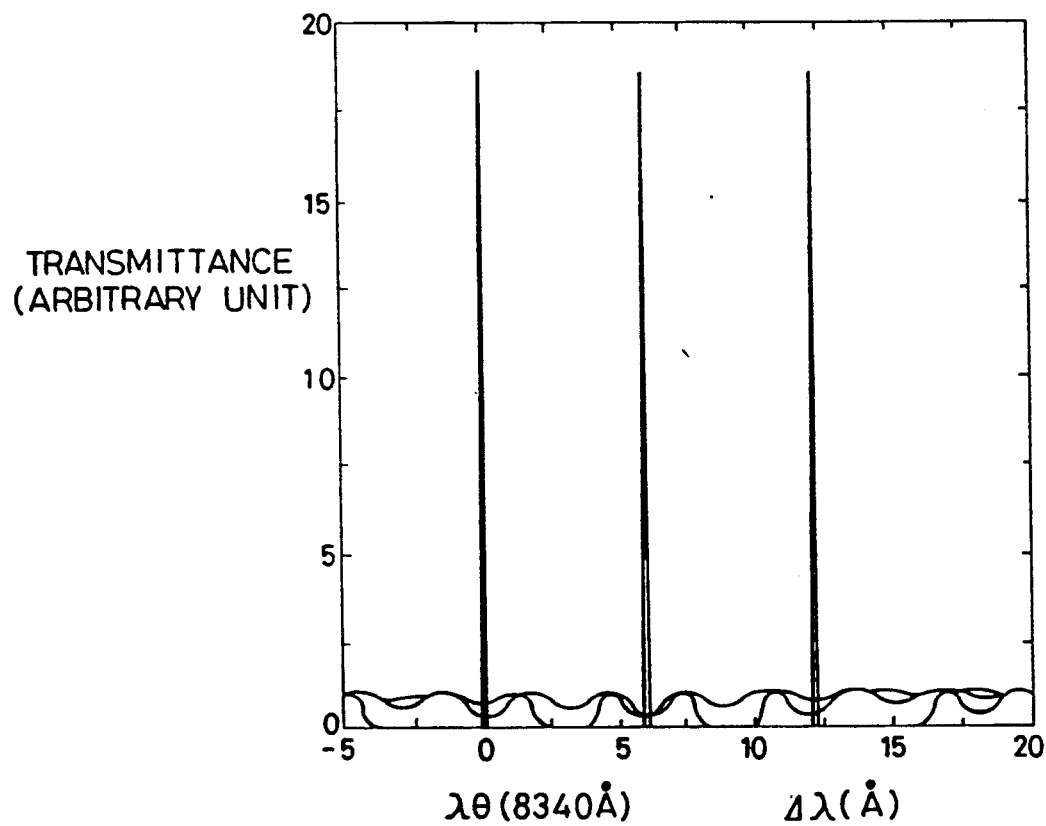
Figure 18:
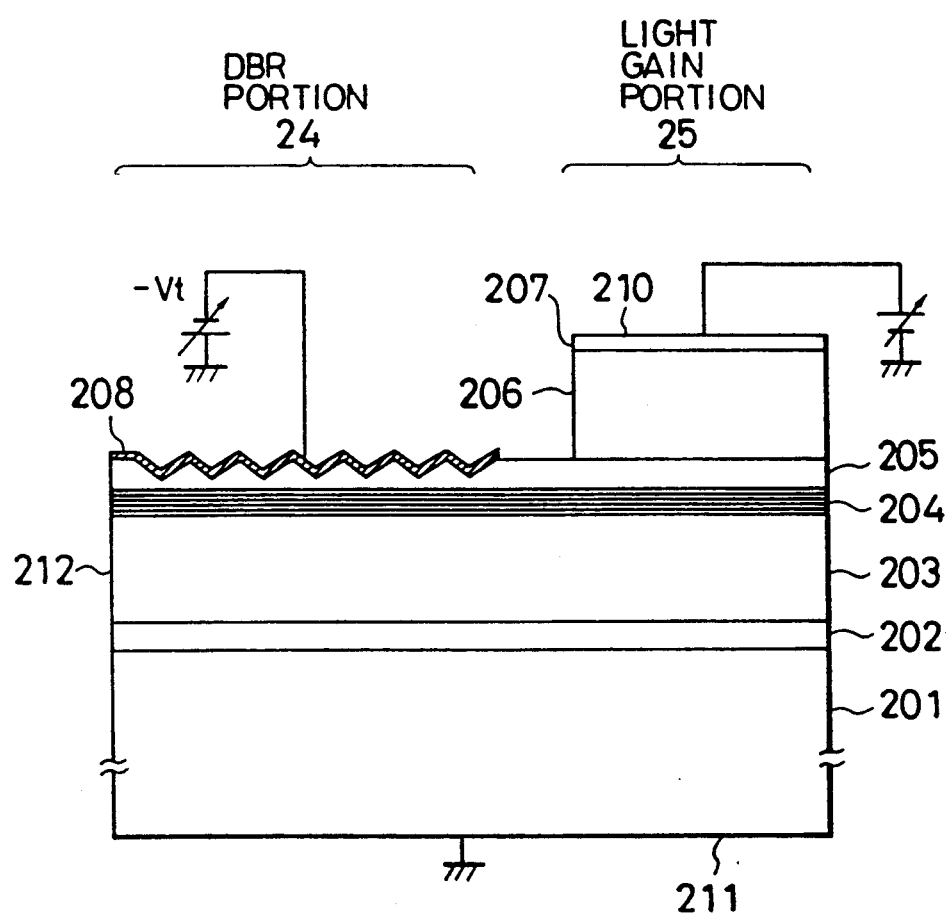
Figure 19:
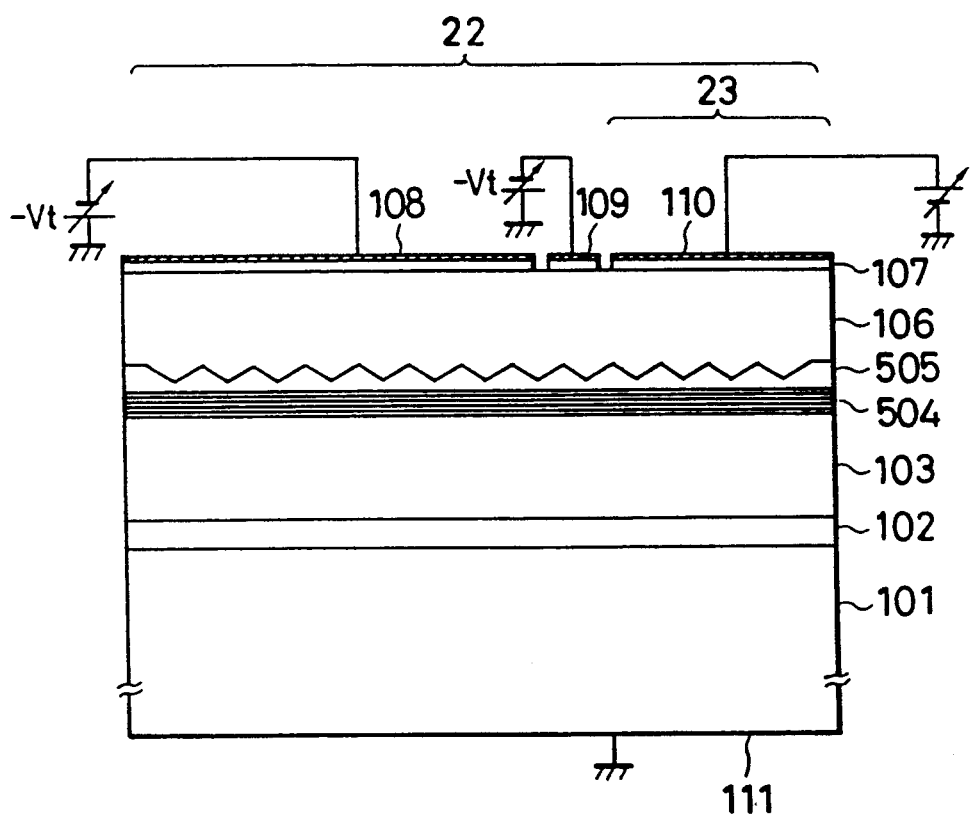
Figure 20:
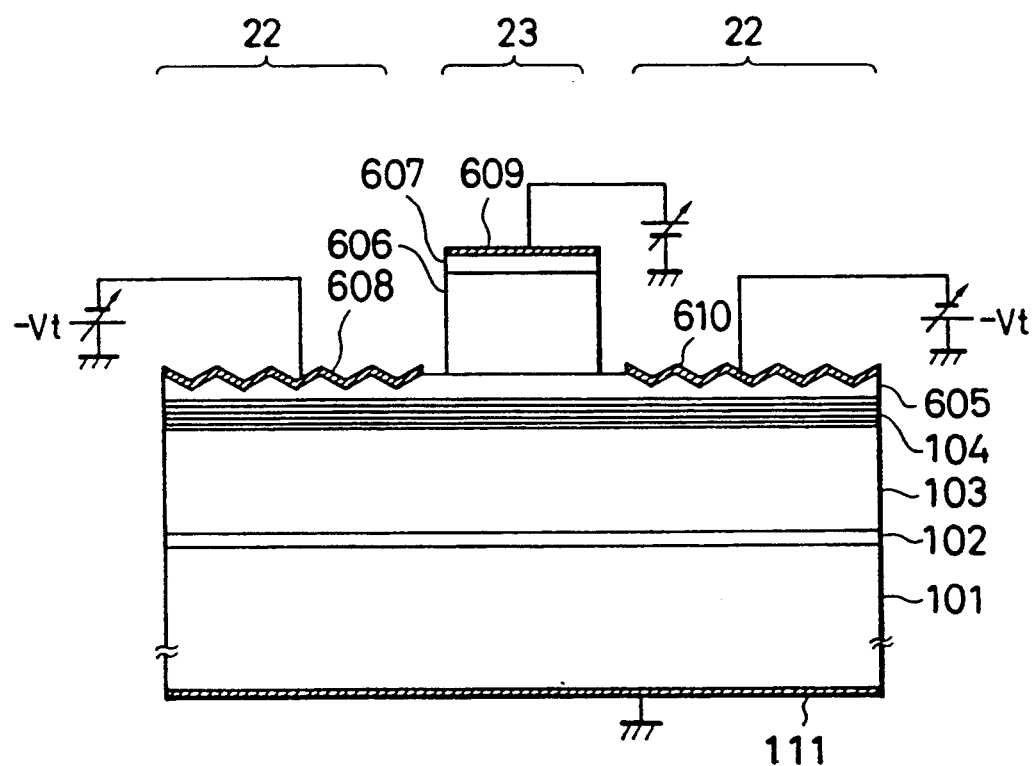

FIG. is a sectional view showing the first embodiment of a semiconductor laser element according to the present invention when viewed from a plane parallel to a resonance direction;

FIG. 4 is a graph showing a change in absorption spectrum of an optical waveguide layer in the element of the present invention;

FIG. 5 is a sectional view showing the second embodiment of a semiconductor laser element according to the present invention when viewed from a plane parallel to a resonance direction;

FIG. 6 is a sectional view showing the third embodiment of a semiconductor laser element according to the present invention when viewed from a plane parallel to a resonance direction;

FIG. 7 is a side sectional view of an element for explaining the principle of a wavelength selective filter according to the present invention;

FIG. 8 is a graph showing the relationship between a wavelength and an absorption coefficient in the element shown in FIG. 7;

FIG. 9 is a graph showing the relationship between a wavelength and a fluctuation ratio of a refractive index in the element shown in FIG. 7;

FIG. 10 is a side sectional view showing the first embodiment of a wavelength selective filter to which the present invention is applied;

FIGS. 11 and 12 are graphs showing spectral transmission characteristics in the filter shown in FIG. 10;

FIG. 13 is a side sectional view showing the second embodiment of a wavelength selective filter to which the present invention is applied;

FIG. 14 is a graph showing spectral transmission characteristics in the filter shown in FIG. 13;

FIG. 15 is a side sectional view showing the third embodiment of a wavelength selective filter to which the present invention is applied;

FIGS. 16 and 17 are graphs showing spectral transmission characteristics of the filter shown in FIG. 15; and FIGS. 18 to 20 are side sectional views showing the fourth to sixth embodiments of wavelength selective filters to which the present invention is applied.

DETAILED DESCRIPTION OF THE PREFERRED EMBODIMENTS

Figure 1:
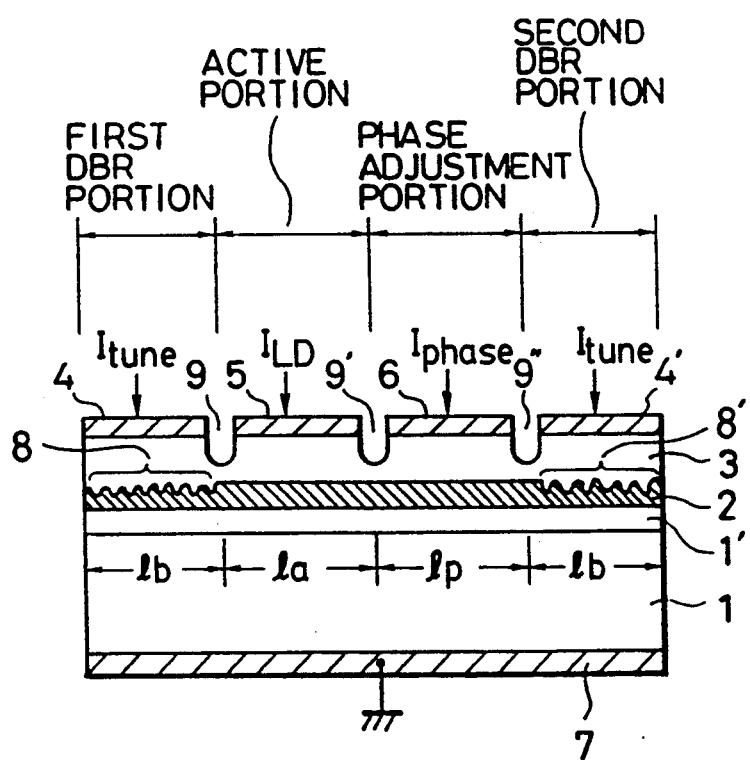
FIG. 1 is a sectional view showing a structure of a conventional semiconductor laser element when viewed from a plane parallel to a resonance direction.
Figure 2:
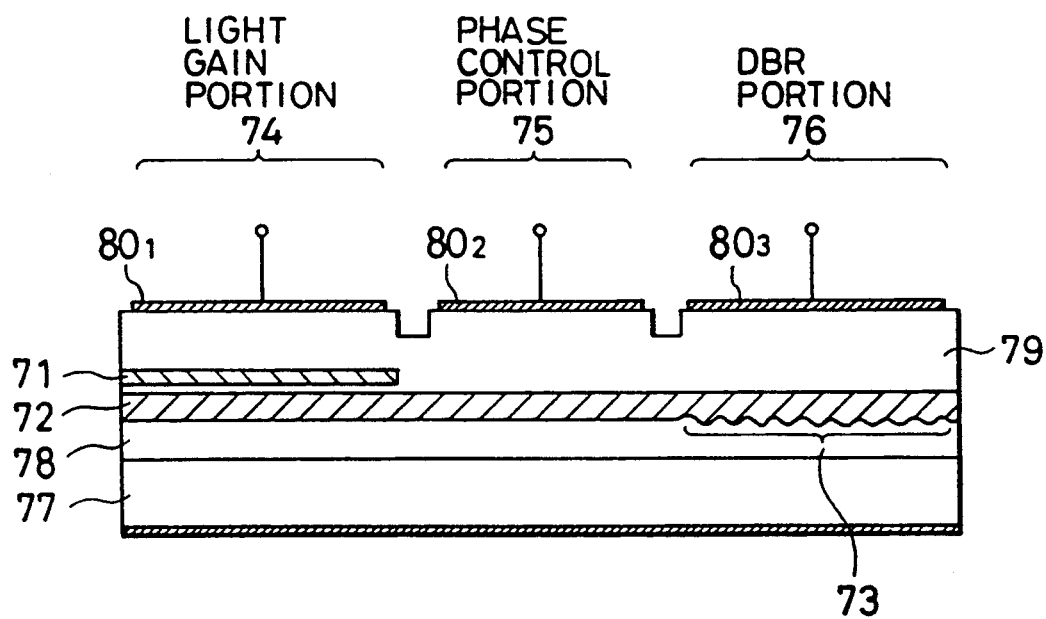
FIG. 2 is a side sectional view showing a structure of a conventional wavelength selective filter.
Figure 3:
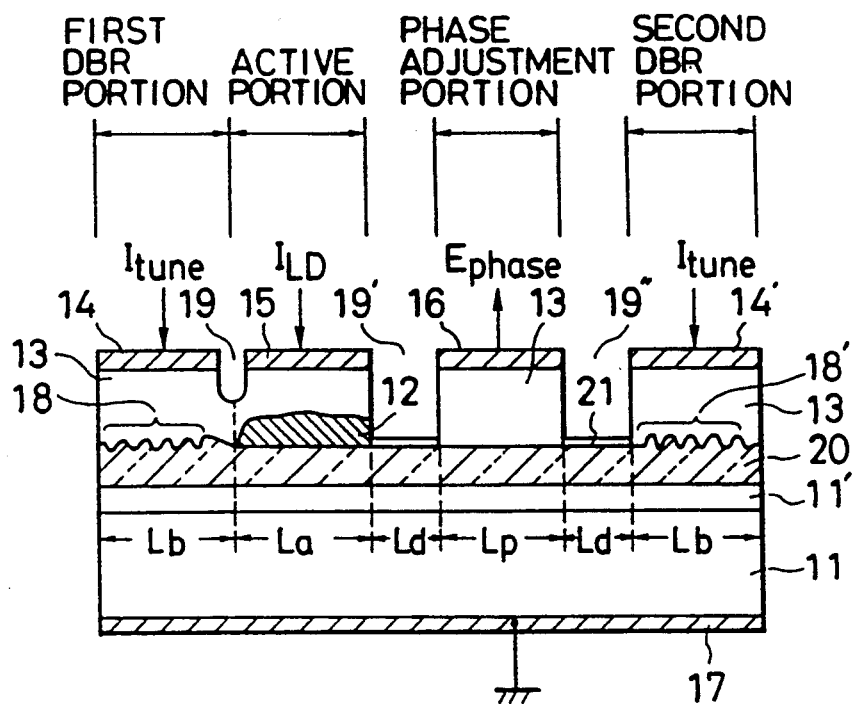

FIG. 3 is a sectional view showing the first embodiment of a semiconductor laser element according to the present invention when viewed from a plane parallel to a resonance direction.

In FIG. 3, an n-type cladding layer 11', an optical waveguide layer 20, an active layer 12, and a p-type cladding layer 13 are sequentially stacked on an n-type semiconductor substrate 11. These semiconductor layers constitute a laser resonator. In this laser resonator, a first DBR portion, an active portion, a phase adjustment portion, and a second DBR portion are juxtaposed in a resonance direction. The active layer 12 is present in only the active portion, and is removed from other portions. The optical waveguide layer 20 has a superlattice structure in which semiconductor thin films or two types having different band gaps are alternately stacked. Diffraction gratings 18 and 18' are respectively formed in the optical waveguide layer 20 of the first and second DBR portions. In order to attain electrical isolation, grooves 19, 19', and 19" are formed at boundaries of these portions. An SiN layer 21 for covering the optical waveguide layer 20 is formed on the bottom portions of the grooves 19' and 19". A common electrode 17 connected to a ground level is formed on the bottom surface of the substrate 11.

In this element, when a current $I_{LD}$ is injected from an electrode to the active layer 12, light is emitted. This light is coupled to the optical waveguide layer 20, and propagates therethrough. Only light components having specific wavelengths of this propagation light are reflected by the diffraction gratings 18 and 18' respectively formed in the first and second DBR portions, thus causing laser resonance. In this state, when a current $I_{tune}$ is injected from electrodes 14 and 14', the refractive index of the optical waveguide layer 20 is changed by a plasma effect, thereby changing an oscillation wavelength.

A reverse bias voltage $E_{phase}$ is applied to a p-n junction of this element. Upon application of this voltage, a quantum confinement Stark effect occurs in the superlattice structure of the optical waveguide layer. With this effect, the refractive index of the layer 20 is changed. For example, for light having a wavelength near an absorption end of the optical waveguide layer, a change in refractive index of about $10^{-2}$ can be expected. This change $\Delta n$ in refractive index is larger by ten times than a conventional change in refractive index of about $10^{-3}$ by the plasma effect. Since almost no current flows through the phase adjustment portion, no heat is generated, and a sufficiently large change in wavelength can be expected as compared to a conventional method. Since a large $\Delta n$ can be obtained, the length of the phase adjustment portion can be decreased. Since the decrease in length can decrease an internal loss, the threshold current of laser oscillation can be advantageously decreased.

EXAMPLE 1

A semiconductor laser element shown in FIG. 3 was manufactured in the following process.

An n-type $Al_wGa_{1-w}As$ cladding layer 11' was grown on an n-type GaAs substrate 11. 60-Å thick GaAs and $Al_yGa_{1-y}As$ layers were alternately stacked on the cladding layer to form an optical waveguide layer 20 having a superlattice structure. A GaAs active layer 12 was then grown on the layer 20. These semiconductor layers were consecutively grown by molecular beam epitaxy (MBE).

The active layer 12 was etched by chemical etching to the optical guide layer 20 to leave an active portion. An SiN coating layer 21 was formed on the resultant structure. The layer 21 was etched to leave formation regions for grooves 19' and 19". Cyclic diffraction gratings 18 and 18' were formed in DBR portions of the exposed optical waveguide layer 20 by a laser interference method. A p-type $Al_xGa_{1-x}As$ cladding layer 13 was grown on the structure. In this case, since no $Al_xGa_{1-w}As$ could be grown on the SiN layer 21, the grooves 19 and 19' were consequently formed.

A groove 19 was then formed by dry etching. The groove 19 can have a small depth since currents are supplied to the DBR portion and the active portion in the same direction, and an electrical isolation therebetween need not be enhanced. Finally, electrodes 14, 14', 15, and 16 were formed by depositing an Au-Zn film. An Au-Sn film was deposited on the bottom surface of the substrate to form a common electrode 17. A length $L_a$ of the active portion, and a length $L_b$ of each of the first and second DBR portions were set to be 200 μm each. A length $L_p$ of the phase adjustment portion was set to be 20 μm, a width $L_d$ of each of the grooves 19' and 19" was set to be 10 μm. The thickness of the active layer 12 was set to be 0.3 μm, the total thickness of the optical waveguide layer 20 was set to be 0.3 μm, and a pitch of the lattice was set to be about 2,500 Å. In the compositions of the above-mentioned layers, y = 0.1, w = 0.4, and x = 0.4.

In the semiconductor laser element prepared as described above, when the current $I_{tune}$ and the voltage $E_{phase}$ were changed, an emission wavelength was changed within the range of 0.855 to 0.845 μm. Single mode laser oscillation could be attained in this wavelength range. In this structure, if n and p conductivity types are replaced, the same effect as described above can be obtained.

In this example, as shown in FIG. 4, the absorption end of an absorption spectrum of the waveguide is set near a laser oscillation wavelength $\lambda_0$. Assuming that the absorption spectrum curve is changed from a solid curve to a dotted curve by the quantum confinement Stark effect, the absorption end is changed from a point A to a point B. In this case, an absorption is enhanced, and a refractive index is considerably decreased. In this manner, in this example, a large change in refractive index could occur to change an oscillation wavelength over a wide range.

EXAMPLE 2

FIG. 5 is a sectional view showing the second embodiment of a semiconductor laser element according to the present invention when viewed from a plane parallel to a resonance direction. The element shown in FIG. 5 was manufactured following the same procedures as in Example 1. The structure of this example is substantially the same as that in Example 1 except that high-resistance regions 31 and 31' are formed in the optical waveguide layer 20 on the bottom portions of the grooves 19' and 19". Therefore, a detailed description of the respective portions will be omitted.

In this example, the regions 31 and 31' were formed by implanting oxygen ions into the bottom portions of the grooves 19' and 19", and annealing the bottom portions. The optical characteristics of the regions 31 and 31' were not changed very much as compared to other portions of the layer 20. With the regions 31 and 31', currents flowing through the active portion and the DBR portions could be prevented from flowing into the phase adjustment portion, and a threshold current of laser oscillation could be further decreased. In addition, a fluctuation range of the Bragg wavelength could be widened.

EXAMPLE 3

FIG. 6 is a sectional view showing the third embodiment according to the present invention. The structure shown in FIG. 6 includes an n-type GaAs substrate 41, an n-type $Al_wGa_{1-w}As$ cladding layer 41', an $Al_yGa_{1-y}As$ active layer 42, a p-type $Al_xGa_{1-x}As$ cladding layer 43, distributed diffraction gratings 48 and 48', grooves 49' and 49" for enhancing electrical isolation, a waveguide layer 50 comprising a GaAs/$Al_yGa_{1-y}As$ superlattice structure, a GaAs etching-stop layer 51, and high-resistance non-doped $Al_wGa_{1-w}As$ layers 52 and 52', for burying the grooves 49' and 49".

In the manufacture, the n-type cladding layer 41', the optical waveguide layer 50, the etching-stop layer 51, and the active layer 42 were successively grown on the n-type GaAs substrate 41 by a conventional MBE method. Thereafter, the active layer 42 was etched by chemical etching to the etching-stop layer 50 to leave an active portion.

The cyclic diffraction gratings 48 and 48' were formed in the DBR portions of the exposed optical waveguide layer 20 by a laser interference method. The $Al_xGa_{1-x}As$ cladding layer 43 was grown on the resultant structure by an LPE method. The grooves 49' and 49" were formed to a depth enough to reach the etching-stop layer 51 by selective wet etching. These grooves 49' and 49" were buried with the non-doped $Al_wGa_{1-w}As$ layers 52 and 52' by LPE. The dimensions of the respective portions were the same as those in Examples 1 and 2, and Al composition ratios $v = 0.05$, $w = 0.4$, $w_, = 0.4$, $x = 0.4$, and $y = 0.2$ were set.

In the element of this example, an oscillation wavelength could be changed within the range of 0.835 to 0.825 µm. In this example, the grooves were buried with the AlGaAs layers to decrease a change in diffraction index distribution on a laser optical path. For this reason, light reflection or a loss occurring at two ends of the phase adjustment portion could be minimized, and single mode oscillation with a more stable output could be attained.

In the structure of this example, if n and p conductivity types are replaced, the same effect as described above can be obtained.

Embodiments of wavelength selective filters to which the present invention is applied will now be described. In these filters, the quantum confinement Stark effect (QCSE) is used to tune a selected wavelength.

The principle of wavelength selection according to the present invention will be described below with reference to the element shown in FIG. 7. In FIG. 7, a first cladding layer 62, an optical waveguide layer 63, and a second cladding layer 64 are formed on a substrate 61. The optical waveguide layer 63 comprises a superlattice structure in which 100-Å thick GaAs well layers and AlAs barrier layers are alternately stacked. A diffraction grating 65 having a grating pitch Λ is formed on the upper portion of the second cladding layer 64.

When light is incident from one end of the element, it propagates through the optical waveguide layer 63. Some light components of the propagation light are absorbed by the layer 63. Of the propagation light components, light components having a wavelength which satisfies the Bragg condition of the diffraction grating 65 are reflected, and are returned to an incidence side. In this manner, filtering of light transmitting through the element shown in FIG. 7 is performed.

When a voltage is applied to the element shown in FIG. 7 by a certain means (not shown), spectral absorption characteristics of the optical waveguide layer are changed. The refractive index of the optical waveguide layer is changed by the QCSE, and the wavelength of the light component reflected by the diffraction grating 65 is also changed accordingly. Therefore, the wavelength of light to be filtered can be tuned by controlling an application voltage to the element.

FIG. 8 is a graph showing the relationship between a wavelength of propagation light and an absorption coefficient in the element shown in FIG. 7. FIG. 9 is a graph showing the relationship between a wavelength and a fluctuation ratio Δn of the refractive index in the element shown in FIG. 7. Curves designated by (0) to (v) in FIGS. 8 and 9 respectively represent results when the following voltages were applied to the element.

(0)... 0 V/cm
(i)... $0.4 \times 10^5$ V/cm
(ii)... $0.8 \times 10^5$ V/cm
(iii)... $1.2 \times 10^5$ V/cm
(iv)... $1.5 \times 10^5$ V/cm
(v)... $1.7 \times 10^5$ V/cm The fluctuation ratio Δn of the refractive index shown in FIG. 9 was obtained from the following Kramers-Kronig relation using differences Δα between absorption coefficients in the state (0) and when the voltages (i) to (v) were applied:

$$\Delta n(\omega) = \frac{C}{\pi} P \int_0^\infty \frac{\Delta \alpha(\omega')}{\omega'^2 - \omega^2} d\omega'$$

(ω: angular frequency of light)

In FIGS. 8 and 9, a wavelength is plotted along the abscissa, and an exiton absorption wavelength of a ground-level electron ie and a heavy hole hh is defined as $\lambda_g$. As can be understood from the results shown in FIG. 8, a large change in absorption caused by an electric field occurs in a range of $\lambda_g$ to $\lambda_1$. In this range, however, although the fluctuation ratio Δn of the refractive index is large, as shown in FIG. 9, Δn < 0 is satisfied upon application of the voltage (v) ($1.7 \times 10^5$ V/cm).

On the other hand, if a grating pitch is represented by Λ, a change $\Delta\lambda_b$ in Bragg-reflection wavelength $\lambda_b$ due to the fluctuation ratio Δn of the refractive index is given by:

$$\Delta\lambda_b = 2\Delta n \Lambda$$

Therefore, when Δn < 0, $\Delta\lambda_b < 0$ is satisfied, and the reflection wavelength is shifted to a short wavelength side. Regarding a loss in the optical waveguide layer, since the shifted wavelength approaches an absorption end, absorption is increased, and a loss becomes large. Furthermore, since the absorption end of the exiton is shifted to a long wavelength side by an applied electric field, a loss is further increased.

For this reason, when a wavelength to be guided is shifted from $\lambda_g$ to the long wavelength side by about 20 nm, i.e., to $\lambda_2$, Δn in this wavelength region is uniformly increased by the electric field, and as a result, the Bragg-reflection wavelength is shifted to the long wavelength side. For this reason, since the shifted wavelength is separated away from the wavelength $\lambda_g$ in the absorption wavelength region of the optical waveguide layer 63, a loss caused by absorption can be reduced.

FIG. 10 is a side sectional view showing a structure of the first embodiment of a wavelength selective filter according to the present invention, and FIGS. 11 and 12 are graphs showing transmission characteristics of guided light.

The manufacturing sequence of this embodiment will be described below. A 2-ηm thick n-type $Al_{0.5}Ga_{0.5}As$ first cladding layer 82 in which Si and Ge as dopants were doped at $1 \times 10^{18}/cm^3$ was formed on an n-type GaAs substrate 81 in which Si and Ge as dopants were doped at $4 \times 10^{18}/cm^3$. A first optical waveguide layer 83 was formed on the layer 82. The first optical waveguide layer 83 comprised a 0.11-µm thick superlattice structure in which 100-Å thick Al$_{0.7}$Ga$_{0.3}$As well layers and 100-Å thick Al$_{0.5}$Ga$_{0.5}$As barrier layers were alternately stacked. Furthermore, a 0.2-μm thick non-doped Al$_{0.3}$Ga$_{0.7}$As second waveguide layer 84 was formed on the layer 83.

Gratings 85, having a pitch of 0.25 μm, for secondarily diffracting light in a wavelength range of 800 to 850 nm were formed on a portion (the left portion in FIG. 10) of the upper surface of the second waveguide layer 84. A pitch changing portion 86 whose pitch was offset by 0.12 μm to form a peak in a wavelength spectrum of transmission light was formed at the central portion of the gratings 85. Thus, waves reflected by the right and left gratings of the pitch changing portion 86 were shifted, and a peak appeared in a transmission spectrum by an etalon effect. A 1.5-μm thick p-type Al$_{0.5}$Ga$_{0.5}$As second cladding layer 87 in which Be and Zn as dopants were doped at $2 \times 10^{18}$/cm$^3$, a 0.5-μm thick p+-type GaAs capping layer 88 in which Be and Zn as dopants were doped at $1 \times 10^{19}$/cm$^3$, and an Au/Cr electrode 89$_1$ were sequentially formed on the upper surface of the resultant structure. An AuGe/Au electrode 89$_2$ was formed on the rear surface of the substrate 81. A 20-μm wide groove 80 was formed to reach the second waveguide layer 84 so that a voltage was applied to only a DBR portion A in which the gratings 85 were formed. Subsequently, the capping layer 88 and the electrode 89$_1$ of an optical waveguide portion B without gratings 85 were removed. Distances in a light propagation directions of the DBR portion A and the optical waveguide portion B were respectively defined as $l_A$ and $l_B$.

In the filter of this embodiment, even when a voltage is applied to the DBR portion A, no voltage is applied to the optical waveguide portion B since the groove is present. Therefore, the absorption coefficient of only the DBR portion is changed upon application of a voltage. For this reason, in this embodiment, as a selected wavelength, wavelengths which are on a longer wavelength side than the exiton wavelength and always have a positive fluctuation ratio of the refractive index [i.e., wavelengths equal to or higher than $\lambda_I$ in FIG. 9] are selected to compensate for a loss caused by absorption. If an increase in absorption coefficient in the DBR portion caused by voltage application is defined as $\Delta\alpha_A(E)$ (> 0), and a decrease in absorption coefficient caused by the fact that guided light is shifted to a long wavelength side is defined as $\Delta\alpha_B(\lambda)$ (< 0), a total absorption coefficient is given by:

$$l_A \Delta\alpha_A(E) + l_B \Delta\alpha_B(\lambda) \quad (3)$$

The waveguide distances $l_A$ and $l_B$ are determined so that formula (3) yields 0. As a result, absorption caused by a change in wavelength of guided light can be compensated for.

The operation of this embodiment will be described below.

This embodiment is used while the electrode 89$_2$ is grounded, and a reverse voltage is applied across the electrodes 89$_1$ and 89$_2$. FIG. 11 shows wavelength dependency of transmittance of light guided when only the DBR portion A of this embodiment is extracted. In FIG. 11, a solid curve represents a result when an application voltage is 0, and a broken curve represents a result when an application voltage is 3 V. As can be apparent from FIG. 11, a peak of a transmission spectrum is shifted by 2 nm toward a long wavelength side upon application of a voltage. In this case, the transmittance of the peak was decreased by absorption, and a fluctuation amount of an absorption coefficient was given by $\Delta\alpha_{A(E)} = 20$ cm$^{-1}$. On the other hand, when light components having wavelengths of 830 nm and 832 nm were guided while extracting the optical waveguide portion B, a fluctuation amount of an absorption coefficient was given by $\Delta\alpha_B(\lambda) = 14.7$ cm$^{-1}$. If the waveguide distance $l_A$ is assumed to be 200 μm, the waveguide distance $l_B$ which does not cause absorption in the waveguide layer can be calculated from formula (3). That is, $$20 \times 200 - 14.7 \times l_B = 0$$

then, $l_B = 272$

FIG. 12 shows results obtained by measuring a spectrum of light emitted through the filter to have $l_A = 200$ μm and $l_B = 272$ μm while changing an electric field.

In FIG. 12, a solid curve represents an emitted light intensity when no voltage was applied. A broken curve and an alternate long and short dashed curve represent results when voltages of 1.5 V and 3 V were applied, respectively. As shown in FIG. 12, a peak intensity upon application of a voltage of 3 V is attenuated by only 0.2 dB as compared to an intensity obtained when no voltage is applied. Thus, it can be understood from FIG. 12 that even when a selected wavelength was changed according to the present invention, a filter having an almost constant emitted light intensity could be obtained.

FIG. 13 is a side sectional view showing a structure of the second embodiment of a wavelength selective filter according to the present invention, and FIG. 14 shows transmission characteristics of guided light of the filter. The same reference numerals in FIG. 13 denote the same parts as in FIG. 10, and a detailed description thereof will be omitted.

In the filter of the first embodiment, the pitch changing portion 86 is formed in the gratings 85 to generate a peak in a transmission spectrum. However, in the filter of this embodiment, the capping layer 88 and the electrode 89$_1$ shown in FIG. 10 are divided by a groove 91 to form divided capping layers 98$_1$ and 98$_2$ and divided electrodes 99$_1$ and 99$_2$. Different voltages are applied from these electrodes 99$_1$ and 99$_2$ to the first waveguide layer 83 of the superlattice structure, thereby generating a peak in the transmission spectrum. For this reason, no pitch changing portion 86 is formed in gratings 95. Other structures are the same as those in the first embodiment.

The operation of this embodiment will be described below with reference to FIG. 14.

In FIG. 14, a solid curve represents a state (state I) when no voltage was applied to the divided electrodes 99$_1$ and 99$_2$ in the same manner as for the solid curve in FIG. 12. A broken curve and an alternate long and short dashed curve represent states when a voltage of 3 V was applied to only the divided electrode 99$_1$ (state II) and when a voltage of 3 V was applied to the divided electrodes 99$_1$ and 99$_2$ (state III). As shown in FIG. 14, a peak in the state I was shifted by 2 Å toward a short wavelength side in the state II, and was shifted by 2 nm toward a long wavelength side in the state III as in the first embodiment. Furthermore, when in the state III a voltage to be applied to the divided electrode 99$_1$ was decreased (state IV), the spectrum curve was further shifted by 2 Å toward a long wavelength side, as represented by an alternate long and two short dashed curve in FIG. 14.

In this manner, when the filter is formed so that different voltages can be applied to the waveguide layer of the superlattice structure, a plurality of peak wavelengths can be formed within a stop bandwidth $\Delta\lambda_s$. A wavelength selection range of 2.4 nm as a whole can be obtained, and can be further widened. In this embodiment, the electrode is divided into two sections. When the number of divided electrodes is increased, finer wavelength selection can be performed, and this invention also incorporates this structure.

In the embodiments of the wavelength selective filters, an increase in absorption coefficient in the DBR portion caused by the QCSE is compensated for by shifting guided light toward a long wavelength side in the optical waveguide portion. Alternatively, an increase in absorption coefficient may be compensated for by forming a light gain portion. This embodiment will be described below.

FIG. 15 is a side sectional view showing the third embodiment of a wavelength selective filter.

The manufacturing process of this embodiment will be described below.

An n+-type GaAs buffer layer 102, an n-type $Al_{0.5}Ga_{0.5}As$ first cladding layer 103, a first optical waveguide layer 104 in which 100-Å thick i-type GaAs layers and i-type $Al_{0.3}Ga_{0.7}As$ layers were alternately stacked to constitute a multi-quantum well structure, and a p-type $Al_{0.3}Ga_{0.7}As$ second optical waveguide layer 105 were sequentially formed on an n-type GaAs substrate 101 by an MBE method.

A protective photoresist was applied to a portion excluding a portion corresponding to a DBR portion 22 in order to form the DBR portion 22 on the portion of the second optical waveguide layer 105. Thereafter, a second photoresist layer was formed to the entire surface including the portion 22. Subsequently, the portion 22 was subjected to two-beam interference exposure using an He-Cd laser, and was developed to form photoresist gratings having a pitch of about 0.24 μm. Grating-like corrugations were formed on the upper surface of the second optical waveguide layer 105 by an RIBE (reactive ion beam etching) method using the photoresist as a mask. Thereafter, all the photoresist layers were removed. In this manner, the DBR portion 22 was formed. Subsequently, a p-type $Al_{0.5}Ga_{0.5}As$ second cladding layer 106 and a p+-type GaAs contact layer 107 were sequentially formed on the resultant structure by an LPE method. An Au/Cr layer serving as electrodes was deposited on the upper portion of the contact layer 107. The Au/Cr layer was divided into a first electrode 108 for the DBR portion, a third electrode 109 as an unnecessary current preventing means for trapping carriers, and a second electrode 110 for a light gain portion, as shown in FIG. 15. The contact layer 107 was also etched accordingly to be divided into three sections. The multilayered structure was polished, and an Au/AuGe layer serving as a fourth electrode 111 was deposited on the rear surface of the substrate 101 to perform alloying.

A $ZrO_2$ anti-reflection film 112 for preventing random reflection was formed on an entrance/exit end face of the formed element on the side of the DBR portion. Thereafter, this element was fixed in a holder, and power sources were connected to the electrodes.

The operation of this embodiment will be described below with reference to FIG. 16.

FIG. 16 shows a change in transmittance in the DBR portion to have the Bragg wavelength $\lambda_B$ as the central wavelength.

In the DBR portion, a transmittance and a reflectance considerably vary according to the wavelength of input light, and at a wavelength sufficiently separated from the Bragg wavelength $\lambda_B$, input light is transmitted without causing diffraction or reflection. When the diffraction grating is not a primary diffraction grating, radiation light is diffracted in the vertical direction of the diffraction grating. In any case, light in such a wavelength region is transmitted through the DBR portion. In contrast to this, at a wavelength near the Bragg wavelength $\lambda_B$, a stop band 221 having a bandwidth of about several to several tens of Å is formed to have the Bragg wavelength $\lambda_B$ as the central wavelength. When optical phases are shifted from each other on two sides of a certain portion, as a boundary, of the DBR portion, a transmission wavelength region 222 having a small spectral width is formed at an arbitrary position in the stop band 221. The transmission wavelength region 222 is shifted according to the phase of the end face of the DBR portion.

In this embodiment, the transmission wavelength region 222 in the stop band 221 is arbitrarily controlled to obtain a wavelength variable optical filter. As a method of shifting the region 222, a method of splitting a portion of the DBR portion to control optical phase shift, a method of controlling the phase at the end face of the DBR portion, a method of controlling an effective pitch of the diffraction grating in the DBR portion, and the like are available. With these methods, the refractive index of a medium is controlled.

In the filter shown in FIG. 15, a voltage $-V_t$ is applied to the DBR portion 22, and a forward current $I_g$ is injected into the light gain portion 23. In this case, in the DBR portion 22, since an application voltage serves as a reverse bias for a p-i-n junction, no carrier is injected, and an electric field is applied to the first optical waveguide layer 104 as an i-type layer. For this reason, the refractive index of the layer 104 in the DBR portion is changed by the QCSE, and an absorption spectrum is also changed. Therefore, the Bragg wavelength of the DBR portion 22 is shifted. In this manner, a selected wavelength is tuned. However, the QCSE causes a large change in refractive index and also causes a large change in absorption coefficient. Thus, a forward bias voltage is applied to the light gain portion 23 to inject a carrier (current $I_g$), thus providing a light gain. The injection current $I_g$ is controlled to compensate for attenuation of light in the DBR portion 22, and to obtain a stable selected transmittance (or amplification factor) regardless of a tuned wavelength.

As described above, according to this embodiment, wavelength tuning in the DBR portion is performed by the QCSE, so that it is possible to theoretically obtain a large change in refractive index, i.e., a wide tuning range without causing heat generation. A change in absorption spectrum or a large absorbed light amount as the disadvantage of the QCSE can be eliminated by forming the light gain portion 23 in the resonator to be adjacent to the DBR portion 22. In the light gain portion 23, a change in refractive index due to the plasma effect is caused by the injection current as well as a light gain, thus changing the phase at the boundary with the DBR portion 22. Therefore, strictly speaking, although a selected wavelength is tuned by a voltage applied to the DBR portion 22 and a current injected into the light gain portion 23, the voltage applied to the DBR portion 22 is dominant in tuning of the selected wavelength since the change in refractive index caused by the QCSE is large and the effective pitch of corrugations is controlled by directly applying a voltage to the DBR portion 22.

The characteristics of the third embodiment manufactured in this manner will be described below. A voltage changing within the range of 0 V to −5 V was applied from the first electrode 108 to the DBR portion 22 to change a transmission wavelength range. A current changing within the range of 20 to 80 mA was injected from the second electrode 110 to the light gain portion so as to control to obtain a constant transmittance (or light gain) upon tuning of a wavelength. A voltage to be applied to the third electrode 109 for trapping a carrier was almost the same as that to be applied to the first electrode, thereby preventing the flow of carriers to the DBR portion 22.

FIG. 17 shows results obtained by measuring a transmission spectrum with a wavelength variable light source using the above-mentioned element. In FIG. 17, a wavelength relative to a transmission wavelength $\lambda_0 = 8,340$ Å as "0" obtained when no voltage was applied is plotted along the abscissa in units of Å. As shown in FIG. 17, as a reverse bias voltage was applied to the DBR portion, the position of a transmission wavelength was shifted. In this case, current injection was performed in the light gain portion 23, as described above, to compensate for a change in absorption coefficient of the DBR portion 22 caused upon application of the reverse bias voltage. Thus, a transmittance (or amplification factor) could be controlled to be constant over the entire wavelength tuning range. The wavelength tuning range has a width of 10 Å or more, and has a possibility of being able to be further widened. Since the QCSE is used in wavelength tuning, a response time can be as very short as 1 ns or less.

In the above embodiment, a reverse bias voltage is applied to the third electrode 109 to prevent the flow of carriers from the portion 23 to the portion 22. As another countermeasure, the following method may be proposed The contact layer 107, i.e., one electrode is separated from the other electrode.

Fe or $O_2$ is doped in a portion between the two electrodes to obtain a high-resistance portion.

A portion between the electrodes is temporarily etched, and a non-doped region is regrown on the resultant gap portion.

FIG. 18 is a side sectional view showing a structure of the fourth embodiment of a wavelength selective filter according to the present invention.

In this embodiment, a filter which can perform the same operation as in the embodiment shown in FIG. 15 is realized by a simpler manufacturing process.

A manufacturing method will be described below.

An $n^+$-type GaAs buffer layer 202, an n-type $Al_{0.5}Ga_{0.5}As$ first cladding layer 203, a first optical waveguide layer 204 comprising an i-type GaAs (thickness = 100 Å)/i-type $Al_{0.3}Ga_{0.7}As$ MQW, an i-type $Al_{0.3}Ga_{0.7}As$ optical waveguide layer 205, a p-type $Al_{0.5}Ga_{0.5}As$ second cladding layer 206, and a $p^+$-type GaAs contact layer 207 were formed on an n-type GaAs substrate 201 by an MBE method. Thereafter, in order to form a light gain portion 25, the resultant structure was etched to a depth enough to expose the cladding layer 206 except for this portion, thereby exposing the second optical waveguide layer 205. Following the same procedures as in the third embodiment, a DBR portion 24 was formed. An Au/Cr layer serving as a second electrode 210 was formed on the contact layer 207 as the light gain portion. After this element was polished, a third electrode 211 was formed on the lower surface of the substrate 201 to perform alloying. An Au first electrode 208 was deposited on the DBR portion 24. Note that an interval between the DBR portion 24 and the light gain portion 25 was about 30 μm, and an anti-reflection film 212 was formed on the end face on the formation side of the DBR portion 24 as in the third embodiment. The element manufactured in this manner was fixed in a holder, and power sources were connected to the electrodes.

In this embodiment, the reason why no carrier trapping electrode is formed is that p-type layers (corresponding to the second cladding layer 106 and the contact layer 107 in FIG. 15) of the DBR portion 24 are removed unlike in the light gain portion 25. For this reason, the flow of carriers could be satisfactorily prevented by slight electrode isolation, and the number of steps in the manufacture could be reduced. Since the first electrode 208 was directly formed on the DBR portion 24, a waveguide absorption loss caused by a metal film occurred. For this reason, an injection current must be slightly increased as compared to that in the third embodiment. The evaluation results of the element were the same as those of the third embodiment.

FIG. 19 is a side sectional view showing a structure of the fifth embodiment of a wavelength selective filter according to the present invention. The same reference numerals in FIG. 19 denote the same parts as in FIG. 15, and a detailed description thereof will be omitted.

In this embodiment, a first optical waveguide layer 504 comprising an MQW consisting of 70-Å thick GaAs layers and 100-Å thick i-type $Al_{0.3}Ga_{0.7}As$ layers is used in place of the first optical waveguide layer 104 in the third embodiment, and a second optical waveguide layer 505 in which corrugations are formed on the entire surface is used in place of the second waveguide layer 105. Other structures are the same as those in the third embodiment.

The electrode is split into three electrodes as in the third embodiment, and an anti-reflection film is formed on two end faces, i.e., input and output surfaces.

In the filter of this embodiment, a reverse voltage $-V_t$ ranging from 0 to −5 V was applied to the first electrode 108 on the DBR portion 22, and the third electrode 109 for trapping carriers, and a current ranging from 10 to 70 mA was injected into the light gain portion, thereby performing wavelength tuning. This embodiment employs a so-called distributed feedback (DFB) structure wherein a light gain is given even in the DBR portion. The principal tuning mechanism of the previous embodiment is to control an effective refractive index of the diffraction grating, while in this embodiment, since phase shift occurs at the central portion of the DBR portion, a wavelength tuning range can be further expanded due to an effect of shift of a transmission wavelength region in the stop band. The tuning range could be about 15 Å or more.

FIG. 20 is a side sectional view showing a structure of the sixth embodiment of a wavelength selective filter according to the present invention. The same reference numerals in FIG. 20 denote the same parts as in FIG. 15, and a detailed description thereof will be omitted.

In this embodiment, DBR portions are respectively formed on two sides of a light gain portion. A second optical waveguide layer 605 on which corrugations were formed at two end portions was used in place of the second optical waveguide layer 105 in the third embodiment, and a second cladding layers 606 and a contact layer 607 were stacked on the central portion of the layer 605. First and second electrodes 608 and 610 were respectively formed on the upper portions of the corrugations, and a third electrode 609 was formed on the upper portion of the contact layer 607. An anti-reflection film (not shown) was formed on two entrance and exit end faces. Other structures are the same as those in the third embodiment.

In this embodiment, a selected wavelength is tuned by controlling the effective pitch of corrugations and controlling a phase shift amount at the central portion in the same manner as in the fifth embodiment. Since the phase shift amount is controlled by changing a light gain, tuning of a selected wavelength mainly depends on control of a reverse voltage $-V_t$ to be applied to the DBR portion 22.

A wavelength tuning range of this embodiment is the same as that in the fourth embodiment. However, in this embodiment, since the DBR portions are formed at two end portions of a resonator, a full width at half maximum of the transmission wavelength region is small, and the number of channels of wavelength tuning can be essentially increased.

According to the present invention, various other applications may be proposed in addition to the above examples. For example, in each example, the semiconductor layers consist of AlGaAs but may be formed of other materials such as InGaAsP. The present invention incorporates such applications within the scope of the appended claims.

What is claimed is:

1. A semiconductor laser element which can change an emission wavelength, comprising:
    a substrate;
    a laser resonator formed on said substrate, said resonator being formed by stacking semiconductor layers including an active layer and an optical waveguide layer of a superlattice structure, and said resonator including a first reflection portion, an active portion, a phase adjustment portion, and a second reflection portion which are juxtaposed in a resonance direction;
    diffraction gratings formed in said optical guide layer of said first and second reflection portions; and
    electrodes independently formed in said active portion, said phase adjustment portion, and said first and second reflection portions.

2. An element according to claim 1, wherein an end portion of an absorption spectrum of said optical waveguide layer is present near an oscillation wavelength of said element.

3. An element according to claim 1, wherein said laser resonator includes n- and p-type cladding layers sandwiching said active layer and said optical waveguide layer therebetween.

4. An element according to claim 3, wherein an etching-stop layer is formed between said optical waveguide layer, and the cladding layer formed on said optical waveguide layer.

5. An element according to claim 1, wherein grooves for attaining electrical isolation are formed at boundaries of the respective portions.

6. An element according to claim 5, wherein the groove formed between said phase adjustment portion and said active portion, and the groove formed between said phase adjustment portion and said reflection portion have a larger depth than that of the groove formed between said reflection portion and said active portion.

7. An element according to claim 5, wherein regions having a high electrical resistance are formed in portions of said optical waveguide layer at positions corresponding to the groove formed between said phase adjustment portion and said active portion, and the groove formed between said phase adjustment portion and said reflection portion.

8. An element according to claim 5, wherein the groove formed between said phase adjustment portion and said active portion, and the groove formed between said phase adjustment portion and said reflection portion are buried with a non-doped semiconductor.

9. An element according to claim 1, wherein each of the semiconductor layers is formed of one compound selected from the group consisting of AlGaAs and GaAs.

10. A method of driving a semiconductor laser element which can change an emission wavelength, said semiconductor laser comprising:
    a substrate;
    a laser resonator formed on said substrate, said resonator being formed by stacking semiconductor layers including an active layer and an optical waveguide layer of a superlattice structure, and said resonator including a first reflection portion, an active portion, a phase adjustment portion, and a second reflection portion which are juxtaposed in a resonance direction;
    diffraction gratings formed in said optical guide layer of said first and second reflection portions; and
    electrodes independently formed in said active portion, said phase adjustment portion, and said first and second reflection portions, comprising the steps of:
    injecting a current from the electrode of said active portion to said active layer to cause laser oscillation;
    injecting a current from the electrodes of said first and second reflection portions to change a refractive index of said optical waveguide layer, thereby changing a wavelength of light undergoing laser oscillation; and
    applying a reverse bias voltage to the electrode of said phase adjustment portion to change a refractive index of said optical waveguide layer by a quantum confinement Stark effect, thereby adjusting a phase of light undergoing laser oscillation.

* * * * *

UNITED STATES PATENT AND TRADEMARK OFFICE
CERTIFICATE OF CORRECTION

PATENT NO. : 5,155,736
DATED : October 13, 1992
INVENTOR(S) : TAKEO ONO and HAJIME SAKATA It is certified that error appears in the above-identified patent and that said Letters Patent is hereby corrected as shown below:

On the cover page, change the Assignee from "International Business Machines Corporation, Armonk, N.Y." to --Canon Kabushiki Kaisha, Tokyo, Japan--; and
change the Attorney, Agent, or Firm from "Curtis G. Rose" to --Fitzpatrick, Cella, Harper & Scinto--.

Column 4, line 3, change "FIG." to --FIG. 3--.

Column 5, line 58, change "$Ga_{1-w}As$" to --$Ga_{1-x}As$--.

Column 6, line 65, change "$Al_{w,}Ga_{1-w,}As$" to --$Al_{w'}Ga_{1-w'}As$--.

Column 7, line 14, change "$Al_{w,}Ga_{1-w,}As$" to --$Al_{w'}Ga_{1-w'}As$--; and
line 17, change "w,=0.4," to --w'=0.4,--.

Column 8, line 62, change "$2-\eta$" to --$2\mu m$--.

Signed and Sealed this

Twentieth Day of July, 1993

Attest:

MICHAEL K. KIRK

*Attesting Officer*     *Acting Commissioner of Patents and Trademarks*